United States Patent
Xu

(10) Patent No.: US 10,033,329 B2
(45) Date of Patent: Jul. 24, 2018

(54) PHOTOVOLTAIC JUNCTION BOX

(71) Applicant: Changshou Fulaide Connector Technology Co. Ltd., Suzhou (CN)

(72) Inventor: Jianming Xu, Suzhou (CN)

(73) Assignee: CHANGSHOU FULAIDE CONNECTOR TECHNOLOGY CO. LTD., Suzhou (CN)

( * ) Notice: Subject to any disclaimer, the term of this patent is extended or adjusted under 35 U.S.C. 154(b) by 0 days.

(21) Appl. No.: 15/118,453

(22) PCT Filed: Mar. 31, 2015

(86) PCT No.: PCT/CN2015/075477
§ 371 (c)(1),
(2) Date: Aug. 11, 2016

(87) PCT Pub. No.: WO2016/149951
PCT Pub. Date: Sep. 29, 2016

(65) Prior Publication Data
US 2018/0013383 A1    Jan. 11, 2018

(30) Foreign Application Priority Data
Mar. 26, 2015    (CN) .......................... 2015 1 0136147

(51) Int. Cl.
| H05K 7/20 | (2006.01) |
| H02S 40/34 | (2014.01) |
| H05K 1/02 | (2006.01) |
| H01R 9/24 | (2006.01) |

(52) U.S. Cl.
CPC ......... *H02S 40/345* (2014.12); *H05K 1/0203* (2013.01); *H05K 7/20336* (2013.01); *H05K 7/20427* (2013.01); *H01R 9/24* (2013.01)

(58) Field of Classification Search
CPC .......................... H02S 40/345; H05K 1/0203; H05K 7/20336; H05K 7/20427; H01R 9/24
USPC ....................................................... 174/548
See application file for complete search history.

(56) References Cited

U.S. PATENT DOCUMENTS 9,806,003 B2 * 10/2017 Smalley .............. H01L 25/0655
2009/0302345 A1 * 12/2009 Chuang ................ H01L 33/641
                                                                  257/99

* cited by examiner

*Primary Examiner* — Sherman Ng
(74) *Attorney, Agent, or Firm* — Jackson IPG PLLC; Demian K. Jackson

(57) ABSTRACT

A photovoltaic junction box comprising a diode module and a circuit board disposed in a box body, and a heat sink mounted on the outer surface of the box body. The diode module is attached to the back side of the heat sink and is electrically connected to cooper conductor. The heat sink is made of aluminum material and a heat-absorbing layer is provided inside the heat sink. The heat-absorbing layer is close to the diode module. The aluminum heat sink provides great thermal conductivity, therefore, can greatly increase the cooling capacity of the junction box. In addition, because metal material for higher temperature resistance is used instead of lower temperature resistance plastic material, the box body would not deform as easy, greatly increase the safety and reliability of the junction box.

9 Claims, 6 Drawing Sheets

PHOTOVOLTAIC JUNCTION BOX

BACKGROUND OF INVENTION

1. Field of the Invention

The present invention is related to the technic field of solar energy photovoltaic components, more specifically, a photovoltaic junction box.

2. Description of Related Art

Solar energy photovoltaic junction boxes play an important role in the solar energy conversion components. It's main function is to connect the electricity generated from a solar cell to an outside power line. With rapid development of the photovoltaic industry, more and more attention are direct to the junction box, because it not only transmit the electricity generated by the solar cell to the outside power line, at the same time, it also provides the protection for the solar cell components.

The junction box in the current technology uses plastic for it's outer casing. Plastic has poor heat dissipation and is prone to deformation under certain condition, and hence, there is a chance of risk.

SUMMARY OF THE INVENTION

The present invention provides a solution to the following technical problems: the junction box in the current technology uses plastic for it's outer casing; and plastic has poor heat dissipation and is prone to deformation under certain condition, and hence, there is a chance of risk.

The present invention provides the following solution:

a photovoltaic junction box comprising a box body, a diode module and a circuit board disposed inside the box body, and a heat sink mounted on the outer surface of the box body. The circuit board comprising copper conductors; and the diode module is attached to the back side of the heat sink and is connected with the copper conductor.

The heat sink in the present invention is made of aluminum material. The heat sink comprising a heat sink base body, heat sink fins disposed on the heat sink base body and a coupling section is provided on one side of the heat sink base body. The heat sink fins are sequentially distributed on the heat sink base body; the heat sink fins distributed on the heat sink base body are in wavy shape. A cavity is provided in the heat sink base body. And a heat absorbing layer is provided inside the cavity close to the diode module.

According to above-mentioned technical solution, the aluminum heat sink is mounted on the outer surface of box body and the diode module is arranged to be in close contact with the aluminum heat sink. The heat emitted from the diode module is directly transmitted to the aluminum heat sink. The aluminum heat sink provides great thermal conductivity, therefore, can greatly increase the cooling capacity of the junction box. In addition, because metal material for higher temperature resistance is used instead of lower temperature resistance plastic material, the box body would not deform as easy, greatly increase the safety and reliability of the junction box.

The aluminum material used in the typical heat sink provides increased cooling effect, however, at the same time are also some drawbacks. There are mainly two drawbacks: first, because of great thermal conductivity of aluminum material, the heat generated from the inside of the junction box would agglomerated on the heat sink. When this happens, the temperature of the heat sink would increase, and the hot heat sink that in contact with the plastic junction box body would cause the box body to deform and as a result leads to detachment of the heat sink from the box body; second, the hot aluminum heat sink that in contact with the diode module for providing the cooling effect also transmit heat from the heat sink to the diode module. To solve these drawbacks, the heat sink base body of the heat sink in the current invention is provided with a cavity that a heat-absorbing layer is provided inside the cavity that close to the diode module. This heat-absorbing layer would absorb the heat emitted from the diode module without conducting heat back to the diode module. Because the heat-absorbing layer is close to the diode module, when the heat-absorbing layer is absorbing heat from the diode module, at the same time, the outer portion of the heat sink would conduct the heat absorbed by the heat absorbing layer to outside environment. As such, prevent increase in temperature of any plastic portion of the box body and the diode module that lead to deformation or damage of the diode module from high temperature.

As an illustration of the above-mentioned heat-absorbing layer in the present invention, the heat-absorbing layer comprising a closed cavity and cavity filling helium or liquid nitrogen. In actual productions, water is often used as a heat-absorbing material. In fact, water has a heat capacity of 4.2 KJ/(Kg·° C.), it is actually less than helium and liquid nitrogen which has the heat capacity of 5.193 KJ/(Kg·° C.) and 4.609 KJ/(Kg·° C.) respectively, therefore, helium or liquid nitrogen can absorb the heat generated from the diode module and junction box better. The heat-absorbing layer in the present invention can be integrated with the heat sink, or can also be independently provided in the cavity of the heat sink. If the closed cavity is independent from the cavity of the heat sink, then the closed cavity is disposed inside the cavity of the heat sink.

On the basis of providing a heat-absorbing layer in the cavity of the heat sink, the cavity of the heat sink is further provided with a layer of micro heat pipe array. The heat pipe array is tightly attached to the heat-absorbing layer, in a top and down fashion and the heat pipe array is positioned away from the diode module. The heat pipe technology was first invented by George Grover in the Los Alamos National Laboratory, USA in 1963. The invention was called "heat pipe" transfer component and fully utilize the principle of heat conduction and the phase change media to quickly conduct heat property, which through heat pipe to conduct heat generated from a heated matter to outside environment. This heat conduction capability is greater than any known metal. The micro heat pipe is a heat pipe with an equivalent diameter of between 0-2 mm where the structure and heat conduction property have been enhanced. The micro heat pipe array is a metal body with a thin plate-like shape and internally arranged with multiple independently operated micro heat pipe, which is a heat conductive component with superconductive property. The size of the heat pipe array can be changed according to the actual need for more flexibility.

In the present invention the heat pipe array is tightly attached to the heat-absorbing layer and away from the diode module and close to the outside environment, as such the heat pipe array can quickly conduct the heat absorbed by the heat-absorbing layer to outside environment.

As a further description on the heat-absorbing layer and the heat pipe array of the present invention: the heat-absorbing layer and the micro heat pipe array layer are in a flat shape, that is they overlap with each other and is secured in cavity of the heat sink; the shape of the heat-absorbing layer and the micro heat pipe array can also be in wavy shape for increasing heat absorbing surface area of the heat-absorbing layer and the heat conductive surface area of the micro heat pipe array.

As an improvement of the heat sink of the present invention, the fins of the heat sink are plated with nano-cooling paint coat. The nano-cooling paint coat is a paint with resin, filler, additives and other materials that dispersed in the paint in a nanoscale that help to increase heat dissipating efficiency, and reduce temperature rising in a heated body. In every day life, we may see many smooth surfaces, such as smooth metal, smooth paint finish, smooth marble surface, smooth plastic surface and etc. But these seemingly smooth surfaces when put under the microscope, you will find the surfaces are not in fact smooth but with many bumps and holes. When the sun light hits the non-smooth heat sink surface the light will deflect on heat fins multiple times which would increase the heat transferred. As a result, even when the inside of the junction box doesn't generate heat, the sun light hitting the junction box will cause the junction box to give off heat and then the heat will be absorbed by the heat sink and eventually the heat would conducted back into inside the junction box. By plating the heat fins with nano-cooling paint coat would ensure a smooth surface of the heat fins and reduce the sun light deflection, and prevent the heat fins from absorbing heat from outside environment. In addition, by plating the heat fins with nano-cooling paint coat also help to dissipate heat from the junction box and prevent heat from transfer into the junction box.

As a further description of above-mentioned diode module in the present invention. The diode module comprising a metal back plate, an insulating housing and a three diode configuration body. A welding leg of the three diodes in the three diode configuration body extends through the insulating housing and welded together with the cooper conductors. The three diodes of the three diode configuration body is arranged in a side by side fashion. The number of cooper conductors equals to the number of the welding leg of the three diodes; the base of each cooper conductors is provided with a welding section.

On the basis of the above-mentioned diode module, the structure of the junction box of the present invention can be more specifically describe as following: the two sides of the metal back plate of the diode module is provided with a mounting hole, the diode module through the mounting holes is connected with box body; two sides of the box body is provided with an outwardly inclined wire connection section, where the wire riveted with the cooper conductors is lead from the wire connection section to outside of the box body.

On the basis of the structure characteristics of the above-mentioned diode module and junction box, the diode module assemble each of the three diodes together and attach them to the back side of the heat sink on the outside of the box body, the cooper conductors that welded together with the diode module provide the electrical connection that greatly reduce the size of cooper conductors and the junction box, and at the same time increase the cooling efficiency of the junction box.

DETAILED DESCRIPTION OF THE PREFERRED EMBODIMENT

Figure 1:
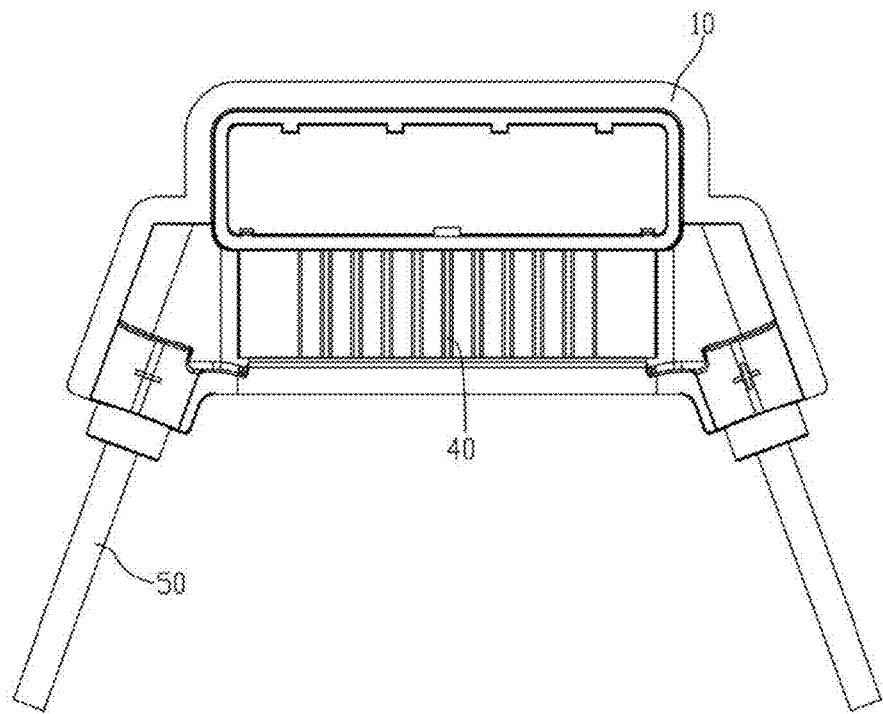
FIG. 1 is a structural representation of the junction box of the present invention.
Figure 2:
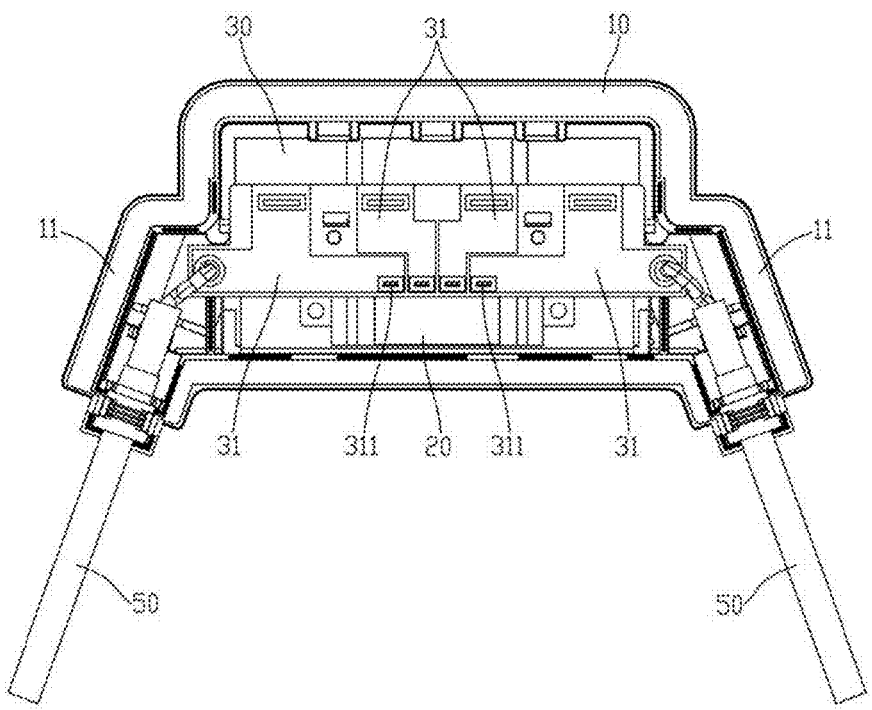
FIG. 2 is the structural representation of interior of the junction box.
Figure 3:
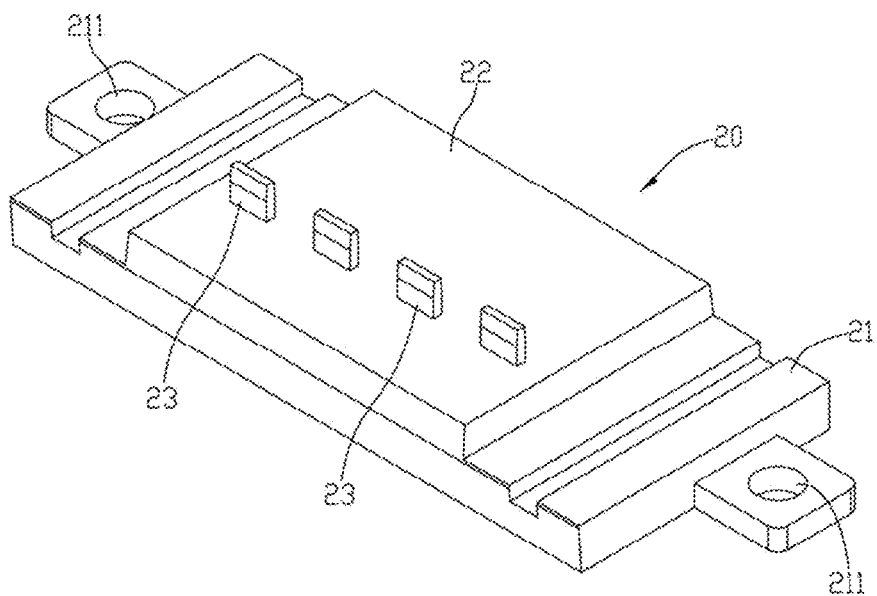
FIG. 3 is the structural representation of the diode module in FIG. 2.

As a first preferred embodiment:

As shown in FIG. 1 and FIG. 2, a photovoltaic junction box comprising a box body 10, a diode module 20 and a circuit board 30 disposed inside the box body 10, and a heat sink 40 mounted on the outside surface of the box body 10. The circuit board 30 comprising cooper conductors 31 and the diode module 20 is attached to the back side of the heat sink 40 and is electrically connected with cooper conductors 31. As shown in FIG. 3, the diode module 20 comprising a metal back plate 21, an insulating housing 22 and a three diode configuration body. Wherein, welding legs 23 extend from the three diodes to outside the insulting housing 22 and are welded together with the cooper conductors 31, as shown in FIG. 2. The three diodes of the diode module 20 are arranged in a side by side fashion, the number of the cooper conductors 31 equals to the number of the welding legs 23 and the welding legs 23 are also arranged in a side by side fashion. In addition, the bottoms of the cooper conductors 31 are provided with welding sections 311, as shown in FIG. 2. As shown in FIG. 3, the two sides of the metal back plate 21 of the diode module 20 are provided with mounting holes 211, the diode module 20 through the mounting holes 311 is connected box body 10. As shown in FIG. 2, the two sides of the box body 10 are provided with outwardly inclined wire connection sections 11, wherein wires 50 riveted with cooper conductors 31 are lead through the wire connection sections 11 to outside of the box body 10.

Figure 4:
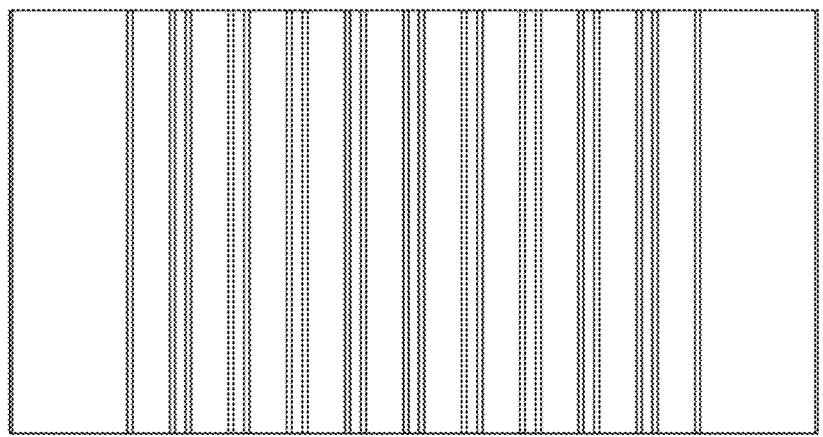
FIG. 4 is the structural representation of the heat sink in FIG. 4.
Figure 5:
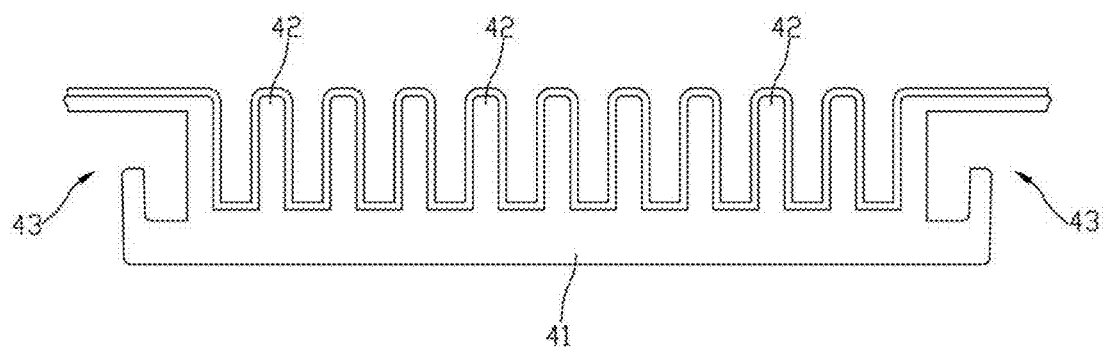
FIG. 5 is the bottom plan view of the heat sink in FIG. 4.

As show in FIG. 4 and FIG. 5, where the heat sink is made of aluminum material and comprising a heat sink base body 41, and heat fins 42 disposed on the heat sink base body 41, and coupling sections 43 provided on two sides of the heat sink base body 41. Wherein, the heat fins 42 are uniformly distributed on the heat sink base body 41 and the heat fins 42 are in wavy shape.

Figure 6:
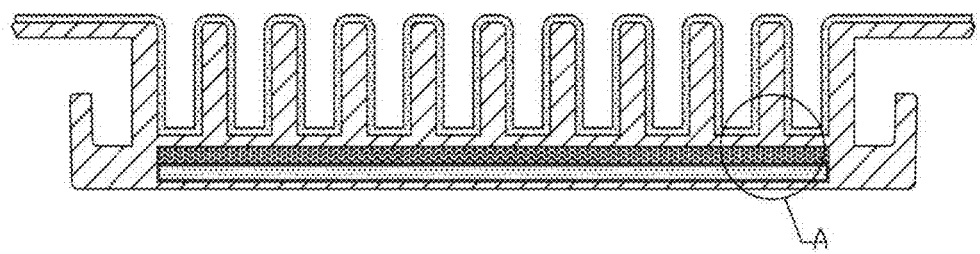
FIG. 6 is the sectional view of the heat sink in FIG. 5.
Figure 7:
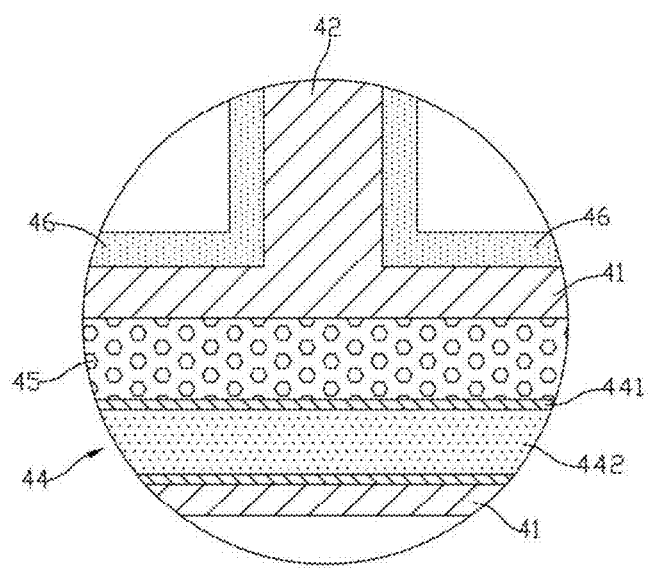
FIG. 7 is the enlarged view of section A of the heat sink in FIG. 6.

As shown in FIG. 6 and FIG. 7, a cavity is provided inside the heat sink base body, a heat-absorbing layer 44 and a micro heat pipe array 45 are provided in the cavity. The heat-absorbing layer 44 and the micro heat pipe array 45 are in a plate shape; wherein, the heat-absorbing layer 44 is close to the diode module 20 and the micro heat pipe array 45 is tightly attached to the heat-absorbing layer 44, wherein the micro heat pipe array 45 overlays on top of the heat-absorbing layer 44, wherein the micro heat pipe array 45 is away from the diode module 20. Wherein, the heat-absorbing layer 44 is provided with a closed cavity 41 filled with helium or liquid nitrogen 442.

As shown in FIG. 6 and FIG. 7, wherein the surface of the heat fins 42 of heat sink 40 is plated with a nano-cooling paint coat 46.

Figure 8:
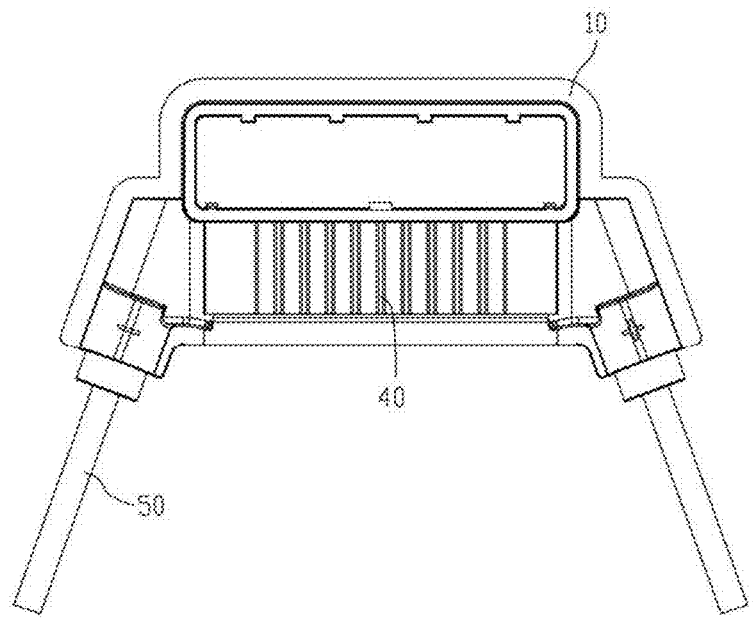
FIG. 8 is another preferred structural representation of junction box.
Figure 9:
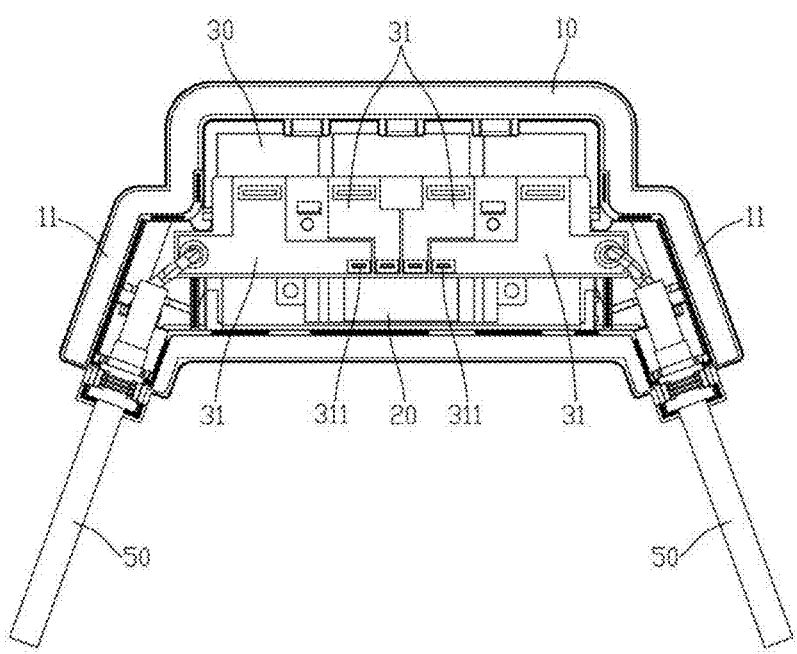
FIG. 9 is the structural representation of interior of the junction box in FIG. 8.
Figure 10:
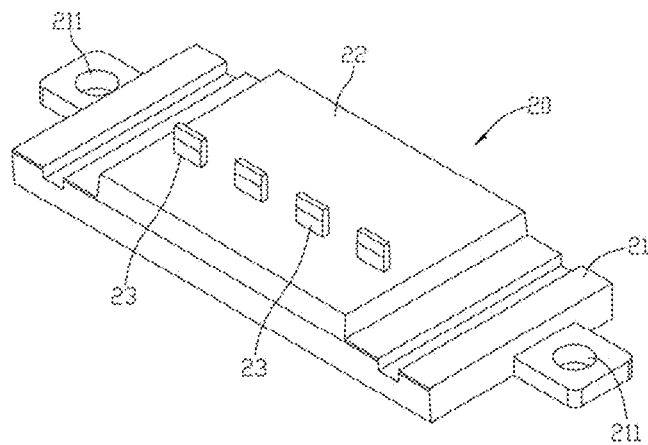
FIG. 10 is the structural representation of the diode module in FIG. 9.

As a second preferred embodiment:

As shown in FIG. 8 and FIG. 9, a photovoltaic junction box comprising a box body 10, a diode module 20 and a circuit board 30 disposed inside the box body 10, a heat sink 40 mounted on the outer surface of the box body 10. The circuit board 30 comprising cooper conductors 31 and the diode module 20 is attached to the back side of the heat sink 40 and is electrically connected with cooper conductors 31. As shown in FIG. 10, the diode module 20 comprising a metal back plate 21, an insulating housing 22 and a three diode configuration body. Wherein, welding legs 23 extend from the three diodes to outside the insulting housing 22 and are welded together with the cooper conductors 31, as shown in FIG. 9. The three diodes of the diode module 20 are arranged in a side by side fashion, the number of the cooper conductors 31 equals to the number of the welding legs 23 and the welding legs 23 are also arranged in a side by side fashion. In addition, the bottoms of the cooper conductors 31 are provided with welding sections 311, as shown in FIG. 9. As shown in FIG. 10, the two sides of the metal back plate 21 of the diode module 20 are provided with mounting holes 211, the diode module 20 through the mounting holes 311 is connected box body 10. As shown in FIG. 9, the two sides of the box body 10 are provided with outwardly inclined wire connection sections 11, wherein wires 50 riveted with cooper conductors 31 are lead through the wire connection sections 11 to outside of the box body 10.

Figure 11:
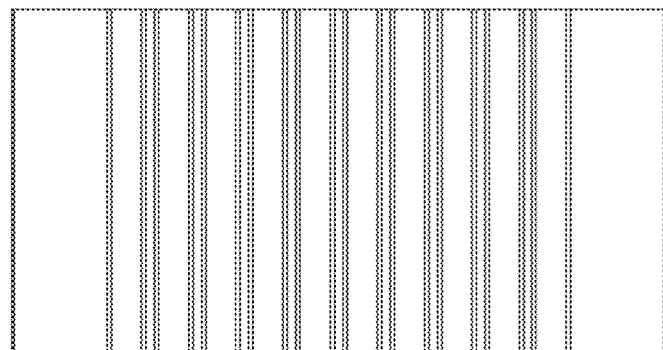
FIG. 11 is the structural representation of the heat sink in FIG. 8.
Figure 12:
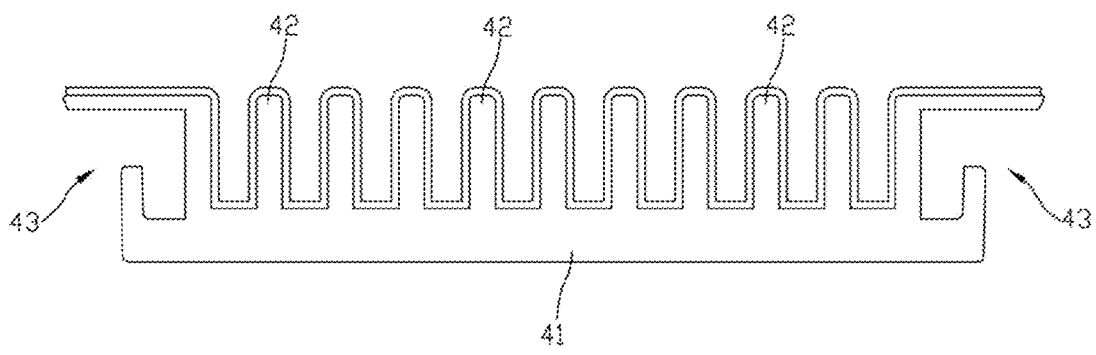
FIG. 12 is the bottom plan view of the heat sink in FIG. 11.

As show in FIG. 11 and FIG. 12, where the heat sink is made of aluminum material and comprising a heat sink base body 41, and heat fins 42 disposed on the heat sink base body 41, and coupling sections 43 provided on two sides of the heat sink base body 41. Wherein, the heat fins 42 are uniformly distributed on the heat sink base body 41 and the heat fins 42 are in wavy shape.

Figure 13:
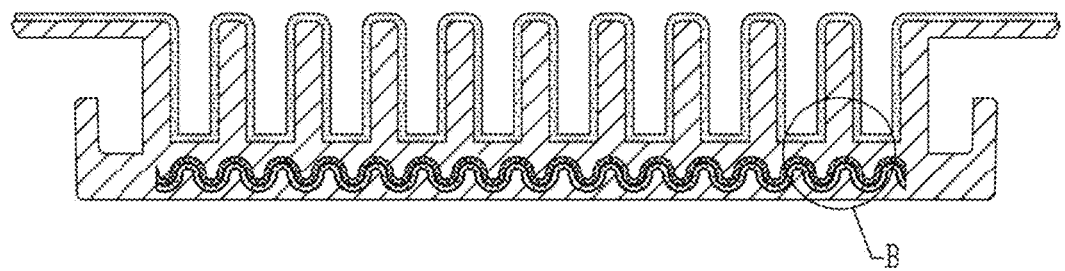
FIG. 13 is the sectional view of the heat sink in FIG. 12.
Figure 14:
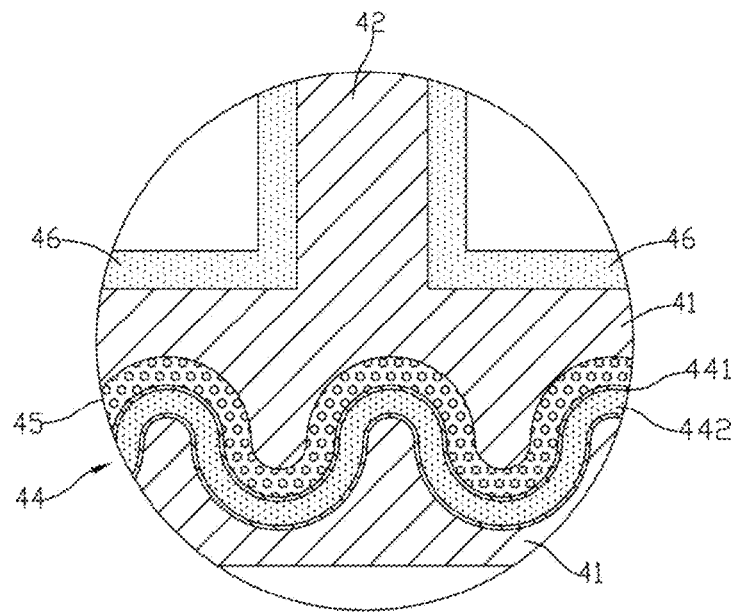
FIG. 14 is the enlarged view of the section B in FIG. 13.

As shown in FIG. 13 and FIG. 14, a cavity is provided inside the heat sink base body, a heat-absorbing layer 44 and a micro heat pipe array 45 are provided in the cavity. The heat-absorbing layer 44 and the micro heat pipe array 45 are in a plate shape; wherein, the heat-absorbing layer 44 is close to the diode module 20 and the micro heat pipe array 45 is tightly attached to the heat-absorbing layer 44, wherein the micro heat pipe array 45 overlays on top of the heat-absorbing layer 44, wherein the micro heat pipe array 45 is away from the diode module 20. Wherein, the heat-absorbing layer 44 is provided with a closed cavity 41 filled with helium or liquid nitrogen 442.

As shown in FIG. 13 and FIG. 14, wherein the surface of the heat fins 42 of heat sink 40 is plated with a nano-cooling paint coat 46.

Although the invention has been explained in relation to its preferred embodiment, it is to be understood that many other possible modifications and variations can be made without departing from the spirit and scope of the invention as hereinafter claimed.

The invention claimed is:

1. A photovoltaic junction box comprising a box body, a diode module and a circuit board disposed inside the box body, and a heat sink mounted on the outer surface of the box body; said circuit board comprising cooper conductors; said diode module is attached to the back side of the heat sink and is electrically connected with the cooper conductors; it is characterized by that: said heat sink is made of aluminum material; said heat sink comprising a heat sink base body, heat fins disposed on the heat sink base body and a coupling section provided on two sides of the heat sink base body; said heat fins are uniformly distributed on the heat sink base body and the heat fins are in wavy shape; said heat sink base body is further provided with a cavity, and a heat-absorbing layer is provided inside the cavity, and the said heat-absorbing layer is close to the diode module.

2. The photovoltaic junction box as claimed in claim 1, wherein said diode module comprising a metal back plate, an insulating housing and a three diode configuration body, wherein, said three diode configuration body comprising three diodes connected together in a side by side arrangement; wherein the three diodes are provided with welding legs that extends through the insulating housing and welded together with the cooper conductors; the number of welding legs equals to the number of cooper conductors that also arranged in a side by side fashion; and the bottoms of said cooper conductors are further provided with a welding section.

3. The photovoltaic junction box as claimed in claim 2, wherein the two sides said metal back plate of the diode module are provided with mounting holes, wherein, the diode module through the mounting holes is connected with the box body.

4. The photovoltaic junction box as claimed in claim 3, wherein the two sides of the said box body are provided with an outwardly inclined wire connection section, wherein wires that riveted with cooper conductors are lead through the wire connection section to outside the box body.

5. The photovoltaic junction box as claimed in claim 1, wherein said heat-absorbing layer of the heat sink is provided with a closed cavity filled with helium or liquid nitrogen.

6. The photovoltaic junction box as claimed in claim 1, wherein said cavity of the heat sink is provided with a micro heat pipe array; wherein said micro heat pipe array is tightly attached to the heat-absorbing layer, that said micro heat pipe array overlays on top of the heat-absorbing layer, and said micro heat pipe array is positioned away from the diode module.

7. The photovoltaic junction box as claimed in claim 6, wherein said heat-absorbing layer and micro heat pipe array are in plate shape.

8. The photovoltaic junction box as claimed in claim 6, wherein said heat-absorbing layer and micro heat pipe array are in wave shape.

9. The photovoltaic junction box as claimed in claim 1, wherein said heat fins of the heat sink is plated with a nano-cooling paint coat.

* * * * *